United States Patent
Le et al.

(10) Patent No.: US 7,623,050 B2
(45) Date of Patent: *Nov. 24, 2009

(54) DIGITAL CALIBRATION LOOP FOR AN ANALOG TO DIGITAL CONVERTER

(75) Inventors: Michael Le, Laguna Niguel, CA (US); Chun-Ying Chen, Irvine, CA (US); Wynstan Tong, Irvine, CA (US); Kwang Young Kim, Irvine, CA (US); Hui Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/637,801

(22) Filed: Dec. 13, 2006

(65) Prior Publication Data

US 2007/0152863 A1    Jul. 5, 2007

Related U.S. Application Data

(60) Provisional application No. 60/749,583, filed on Dec. 13, 2005.

(51) Int. Cl.
    *H03M 1/06*    (2006.01)
(52) U.S. Cl. ........................................ 341/118; 341/155
(58) Field of Classification Search .......... 341/118–155
    See application file for complete search history.

(56) References Cited

U.S. PATENT DOCUMENTS

| | | | |
|---|---|---|---|
| 3,651,517 A | 3/1972 | Kurek et al. | |
| 5,732,276 A | 3/1998 | Komatsu et al. | |
| 5,783,977 A | 7/1998 | Chethik | |
| 5,818,370 A * | 10/1998 | Sooch et al. | 341/120 |
| 5,914,638 A | 6/1999 | He | |
| 6,348,886 B1 | 2/2002 | Frank et al. | |
| 6,392,581 B1 | 5/2002 | Yang | |
| 6,525,615 B1 * | 2/2003 | Masenas et al. | 331/34 |
| 6,603,416 B2 * | 8/2003 | Masenas et al. | 341/120 |
| 6,812,777 B2 | 11/2004 | Tamura et al. | |
| 6,963,237 B2 | 11/2005 | Tamura et al. | |
| 7,003,023 B2 | 2/2006 | Krone et al. | |
| 7,046,179 B1 * | 5/2006 | Taft et al. | 341/120 |
| 7,102,555 B2 * | 9/2006 | Collins et al. | 341/120 |
| 7,209,172 B2 * | 4/2007 | Jelley et al. | 348/308 |
| 7,307,572 B2 * | 12/2007 | Garrity et al. | 341/172 |
| 7,456,764 B2 | 11/2008 | Chen | |
| 7,466,249 B2 | 12/2008 | Chen | |
| 2003/0081706 A1 | 5/2003 | Ciccarelli et al. | |
| 2004/0076360 A1 | 4/2004 | Chen et al. | |
| 2005/0123036 A1 | 6/2005 | Rahman et al. | |
| 2006/0160511 A1 | 7/2006 | Trichy et al. | |
| 2007/0132617 A1 | 6/2007 | Le | |
| 2007/0132625 A1 * | 6/2007 | Chen | 341/155 |
| 2007/0132627 A1 | 6/2007 | Chen | |

(Continued)

*Primary Examiner*—Lam T Mai
(74) *Attorney, Agent, or Firm*—Sterne, Kessler, Goldstein & Fox P.L.L.C.

(57) ABSTRACT

A method and apparatus to counter effects of an offset voltage by calibrating an analog-to-digital converter (ADC). A digital calibration loop minimizes the effects of offset voltage to improve ADC accuracy as well as provide a low-power, sub-micron-scale ADC. A calibration circuit senses an ADC output and adjusts a variable calibration voltage to counter the effects of the offset voltage. Reduction of the offset voltage effects increases the ADC accuracy.

32 Claims, 10 Drawing Sheets

U.S. PATENT DOCUMENTS

| | | |
|---|---|---|
| 2007/0132628 A1 | 6/2007 | Chen |
| 2007/0146191 A1 | 6/2007 | Iwata et al. |
| 2008/0129567 A1 | 6/2008 | Lee et al. |
| 2009/0058698 A1 | 3/2009 | Chen |
| 2009/0058699 A1 | 3/2009 | Chen |
| 2009/0058700 A1 | 3/2009 | Chen |

* cited by examiner

DIGITAL CALIBRATION LOOP FOR AN ANALOG TO DIGITAL CONVERTER

CROSS REFERENCE TO RELATED APPLICATIONS

This application claims the benefit of U.S. Provisional Application No. 60/749,583, filed Dec. 13, 2005, which is incorporated herein by reference in its entirety.

FIELD OF THE INVENTION

The present invention is generally directed to an analog-to-digital converter (ADC). More particularly, the invention relates to a calibration circuit for an ADC.

BACKGROUND

The market demands a low-power, high accuracy analog-to-digital converter (ADC). Therefore, it is desirable to reduce a size of a CMOS comparator in the ADC to a submicron scale because smaller comparators have less input capacitance and thus the stage that drives the comparators requires less power. However, as gate size of the transistors in the comparator become smaller, a reduction in gate size increases the intrinsic offset voltage in a differential comparator. The offset voltage is not a function that is designed into a circuit, but is an inherent characteristic of submicron scale devices. Compounding this problem is randomness of an offset voltage magnitude. Therefore, when an analog signal is compared by a submicron-size comparator, the analog signal is compared to the sum of the offset voltage and the ideal reference voltage. Comparator accuracy is reduced when the analog signal is compared to both the reference voltage and the offset voltage instead of only to the reference voltage. Changes in comparator accuracy affect ADC accuracy. Thus, ADC accuracy decreases with a reduction in comparator size. This is due to the fact that the standard deviation of the offset voltage increases as the transistor gate size is decreased.

What is needed is an ADC with a small, low-power comparator that does not reduce ADC accuracy. Also needed is an apparatus and method to counter the effects of the offset voltage by calibrating the ADC as well as overcome other shortcomings noted above.

BRIEF SUMMARY

A method and apparatus counters effects of an offset voltage by calibrating an analog-to-digital converter (ADC). A digital calibration loop minimizes the effects of an offset voltage to improve ADC accuracy and signal-to-noise ratio as well as provide a low-power, submicron-scale ADC.

In an embodiment, a conversion circuit samples and converts an analog signal to a binary-encoded digital representation of the analog signal. The conversion circuit also counters effects of the offset voltage. The conversion circuit has an ADC coupled to a calibration circuit. The conversion circuit has two modes, a calibration mode and a normal mode. During the calibration mode, the calibration circuit compares a fixed voltage to a variable voltage with the ADC to determine the offset voltage. If no offset voltage is present or the effects of the offset voltage have already been countered, a ratio of logic high signals to logic low signals over time at the ADC output is substantially equal to one. If the offset voltage is present or the effects of the offset voltage are countered, a ratio of logic high signals to logic low signals at the ADC output over time is greater than one or less than one. The calibration circuit integrates the ADC output to determine a control signal. The control signal varies the variable voltage to at least partially counter the offset voltage. The cycle repeats until the offset voltage has been countered.

The conversion circuit then enters the normal mode by switching an ADC input from the fixed voltage to an analog input signal. The analog input signal is tracked and held by a track-and-hold circuit. The ADC compares an output of the track-and-hold circuit to the now-calibrated variable voltage to convert the output of the track-and-hold circuit to a digital signal. An encoder converts the output of an ADC array to a binary-coded output signal when the analog input signal is input to an array of ADCs.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
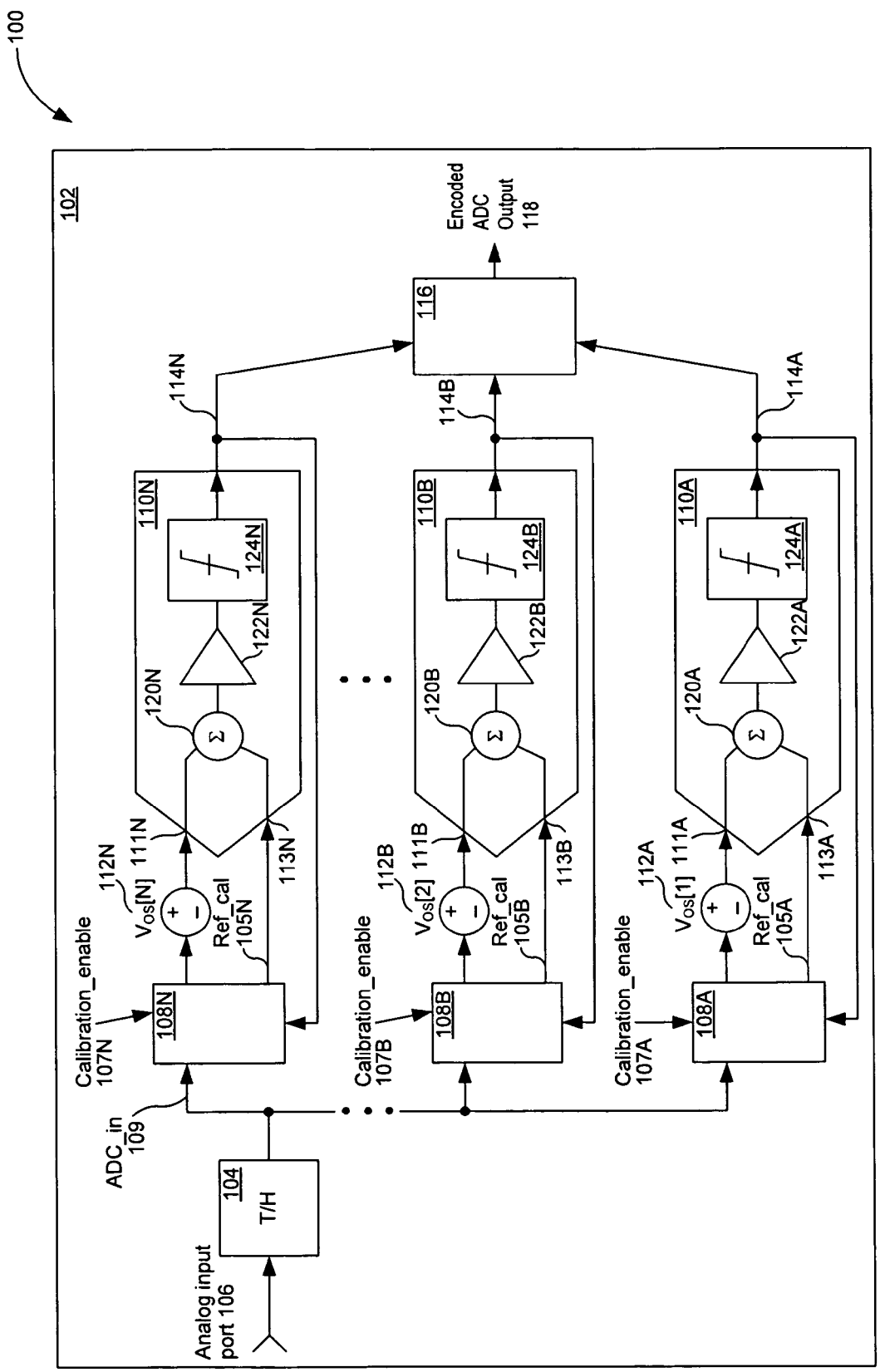
FIG. 1 illustrates an example of an analog-to-digital (ADC) conversion circuit.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

As introduced above, various embodiments involve an apparatus and/or method for a calibration loop for an analog to digital converter. FIGS. 1-10, described below, illustrate this approach.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is within the knowledge of one skilled in the art to effect such feature, structure, or characteristic in connection with other embodiments whether or not explicitly described.

Conversion Circuit

Figure 2:
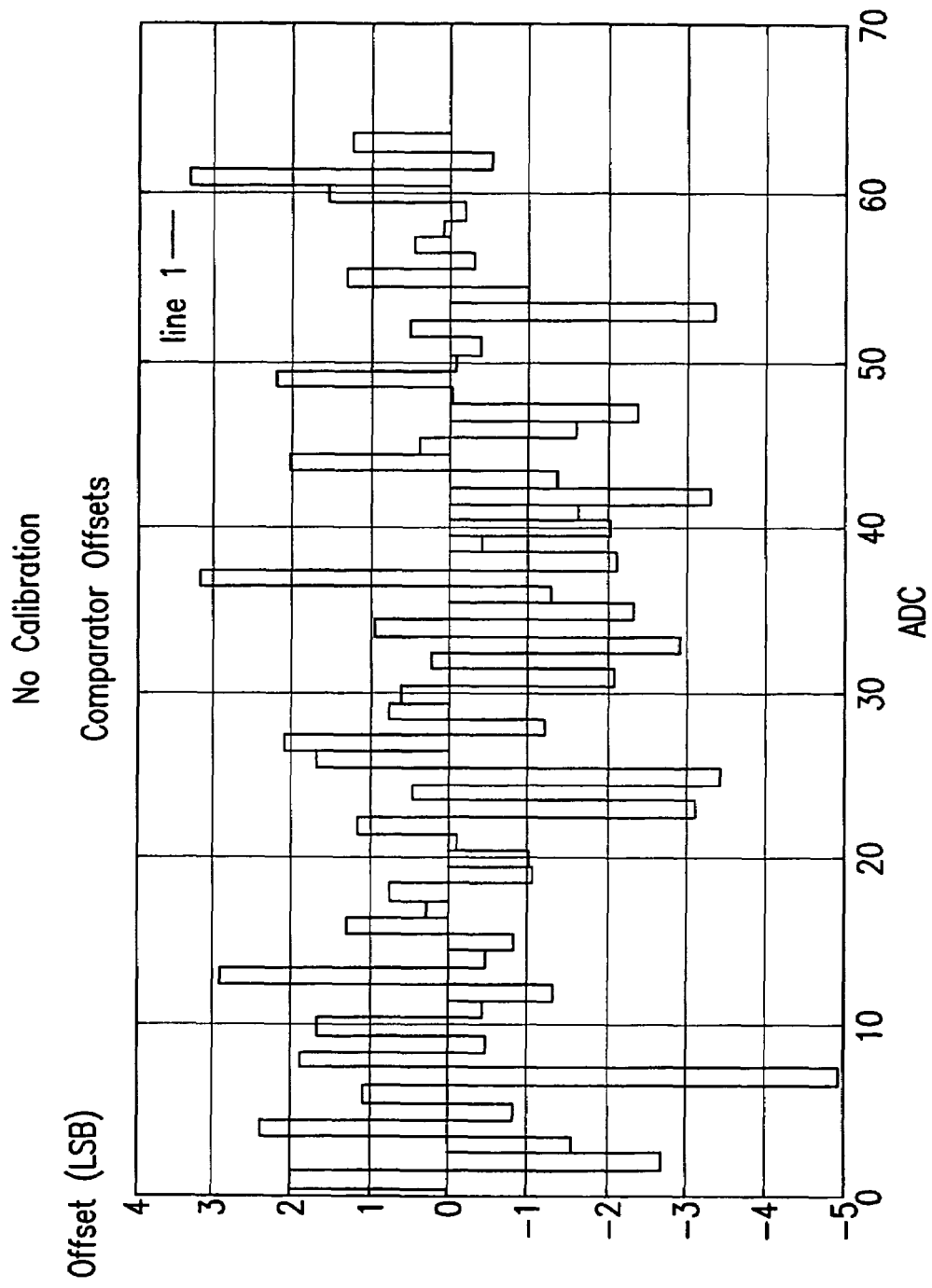
FIG. 2 illustrates exemplary offset voltages before calibration.
Figure 3:
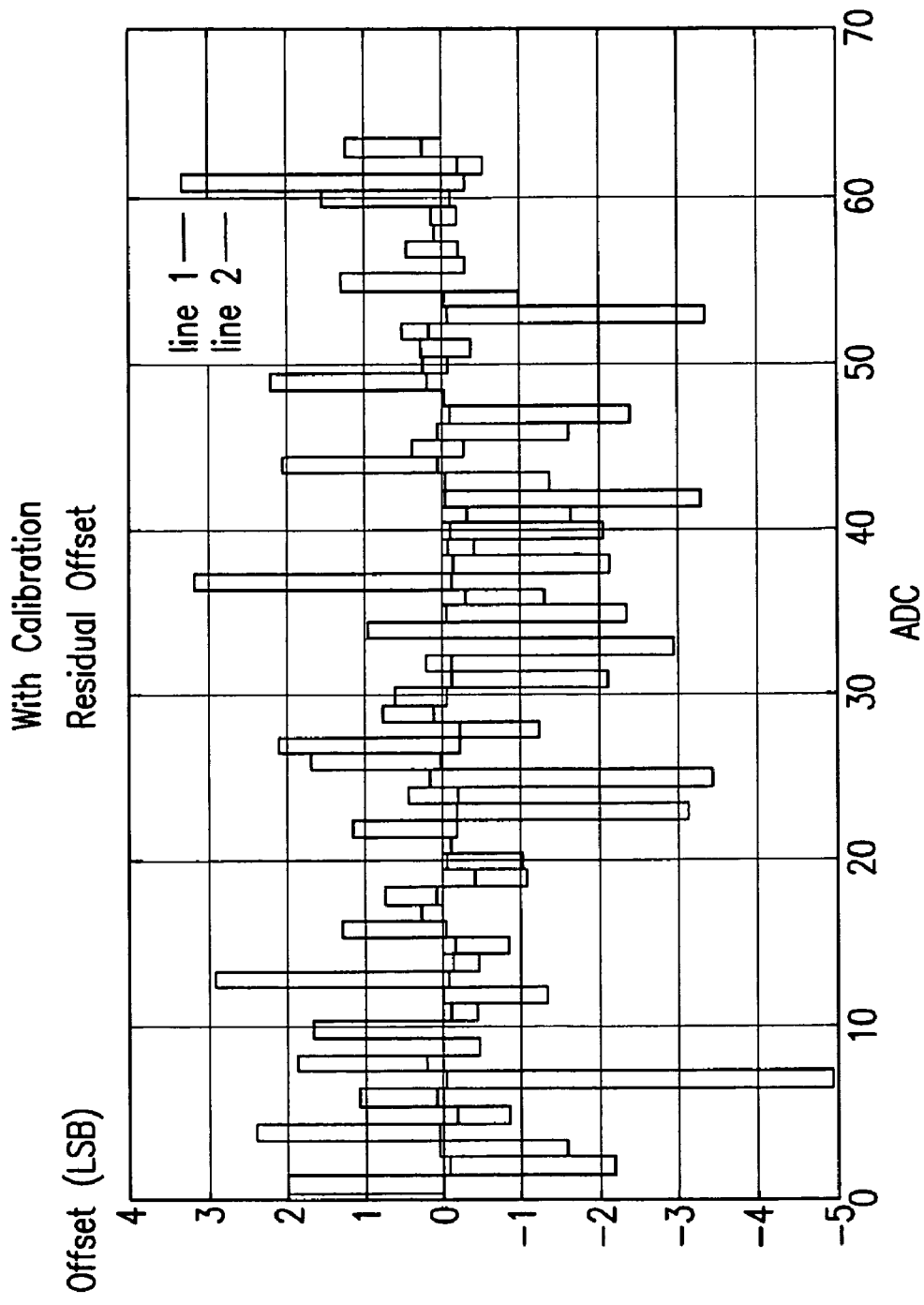
FIG. 3 illustrates exemplary offset voltages after calibration.

FIG. 1 illustrates an exemplary analog-to-digital conversion circuit 100 as discussed below. The conversion circuit 100 samples and converts an analog signal to a binary-encoded digital representation of the analog signal. The conversion circuit 100 counters the effects of a random offset voltage in each comparator to improve digital-to-analog conversion accuracy and signal-to-noise ratio. FIGS. 2 and 3 show the benefit of the conversion circuit by illustrating an exemplary reduction in offset voltages in an array of sixty-four analog-to-digital conversion circuits (comparators). The conversion circuit 100 consumes only a low quantity of power because of its small size. At least part of the conversion circuit 100 is deposited on a substrate 102.

The conversion circuit 100 has an analog input port 106 coupled to a track-and-hold circuit (T/H) 104. An ADC input (ADC_in) 109 from the track-and-hold circuit (T/H) 104 is coupled to an input of a calibration circuit 108A, B, ..., N. In examples, the track-and-hold circuit (T/H) 104 is optional and the analog input port 106 is coupled to a circuit other than the track-and-hold circuit 104, such as the calibration circuit 108. A calibration enable port 107A, B, ..., N is coupled to the calibration circuit 108. A first and second output of the calibration circuit 108 are coupled respectively to a first input 111A, B, ..., N and a second input 113A, B, ..., N of an analog-to-digital converter (ADC) 111A, B, ..., N. The ADC 110 has an ADC output 114A, B, ..., N coupled to both the calibration circuit 108 and an encoder 116. The encoder 116 has an encoder output 118 which is an output of the conversion circuit 100. In examples, the ADC output 114 is not coupled to the encoder 116. In examples, the calibration enable port 107 is coupled to a control circuit. In examples, the control circuit is a digital logic circuit.

Circuit blocks within the conversion circuit 100 function as follows. An analog signal is input to the analog input port 106. The track-and-hold circuit 104 has a track mode and a hold mode. During the track mode, the track-and-hold circuit 104 tracks the analog signal at the analog input port 106 to produce the ADC input (ADC_in) 109 which is input to the calibration circuit 108. The ADC input (ADC_in) 109 signal substantially equals the analog signal at the analog input port 106 during the track mode. During the hold mode, the track-and-hold circuit 104 holds the ADC input (ADC_in) 109 at a constant voltage equal to that of the analog signal present at the analog input port 106 at the moment the hold mode started.

The calibration circuit 108 selectively couples either the ADC input (ADC_in) 109 or a fixed voltage to the ADC first input 111. The calibration circuit 108 also provides a calibration voltage (Ref_cal) 105A, B, ..., N to the ADC second input 113 for comparison by the ADC 110. The calibration voltage (Ref_cal) 105 is a differential voltage. The calibration circuit 108 determines an offset voltage 112A, B, ..., N based on the ADC output 114 and adjusts a variable voltage to provide the calibration voltage (Ref_cal) 105. After calibration, the calibration voltage (Ref_cal) 105 counters the effects of the offset voltage 112. The calibration circuit 108 structure and operation is described in detail below.

The offset voltage 112 is not an element that is designed into a circuit, but is an inherent characteristic of submicron-scale CMOS devices that is present in a comparator 124A, B, ..., N within the ADC 110. The offset voltage 112 is illustrated in FIG. 1 to show its effect on a signal input to the ADC 110. The offset voltage 112 is positive or negative. The offset voltage 112 is of random magnitude, random polarity, and unique to each and every ADC 110.

The ADC 110 is a one-bit analog-to-digital converter having at least the first input 111 and the second input 113. The ADC 110 structure and operation is described in detail below. An output signal present at the ADC output 114 is either a logic "high" (and/or a digital "1") or a logic "low" (and/or a digital "−1"). In examples, the logic "low" is a digital "0". An array of ADCs 100 as shown in FIG. 1 produces a thermometer code signal which is input to the encoder 116.

The encoder 116 converts the thermometer code to a binary code. In examples, the encoder converts the input thermometer code to a code other than binary code. The binary code present at the encoder output 118 is a digital representation of the analog input signal present at the analog input port 106.

In an embodiment, a multi-bit conversion circuit has DC offset calibration. Each bit of the conversion circuit has a reference ladder, a first multiplexer, a second multiplexer, and an analog-to-digital converter (ADC). The reference ladder has a plurality of taps that generate a plurality of reference voltages, including a center tap reference voltage. The first multiplexer has a first input configured to receive an analog signal and a second input coupled to the center tap reference voltage. The second multiplexer is coupled to an output of the reference ladder for selecting one of the plurality of reference voltages as a calibration reference voltage. The analog-to-digital converter (ADC) has an analog signal input coupled to an output of the first multiplexer, as well as a reference signal input coupled to an output of the second multiplexer. During calibration, the first multiplexer is configured to couple the center tap reference voltage to the analog signal input of the ADC.

ADC Circuit

In an example illustrated in FIG. 1, the ADC 110 is comprised of a summation circuit 120A, B, ..., N which is coupled to an amplifier 122A, B, ..., N and the comparator 124. The first input 111 and the second input 113 are coupled to the summation circuit 120. An output of the comparator 124 is coupled to the ADC output 114. The comparator 124 is a submicron-scale CMOS device, thus it consumes very low power.

The summation circuit 120 subtracts the second input 113 signal from the first input 111 signal to produce an output signal that is a difference between the second input 113 signal and the first input 111 signal. The output signal of the summation circuit 120 is input to the amplifier 122. The amplifier 122 adjusts gain and outputs an analog signal to the comparator 124. The comparator 124 quantizes the output signal of the amplifier 122. If the input signal to the comparator is greater than zero, it will output a binary decision equal to "1". If the input signal is less than zero, it will output a binary decision equal to "0". In examples, the comparator reference voltage is a voltage other than zero volts. If the output of the amplifier 122 is positive relative to the comparator reference voltage, then the comparator output is a logic "high" and/or a digital "1". If the output of the amplifier 122 is negative relative to the comparator reference voltage, then the comparator output is a logic "low" and/or a digital "0". In examples, if the output of the amplifier 122 is positive relative to the comparator reference voltage, then the comparator output is a logic "high" and/or a digital "1". In examples, if the output of the amplifier 122 is negative relative to the comparator reference voltage, then the comparator output is a logic "low" and/or a digital "0".

Calibration Circuit

Figure 4:
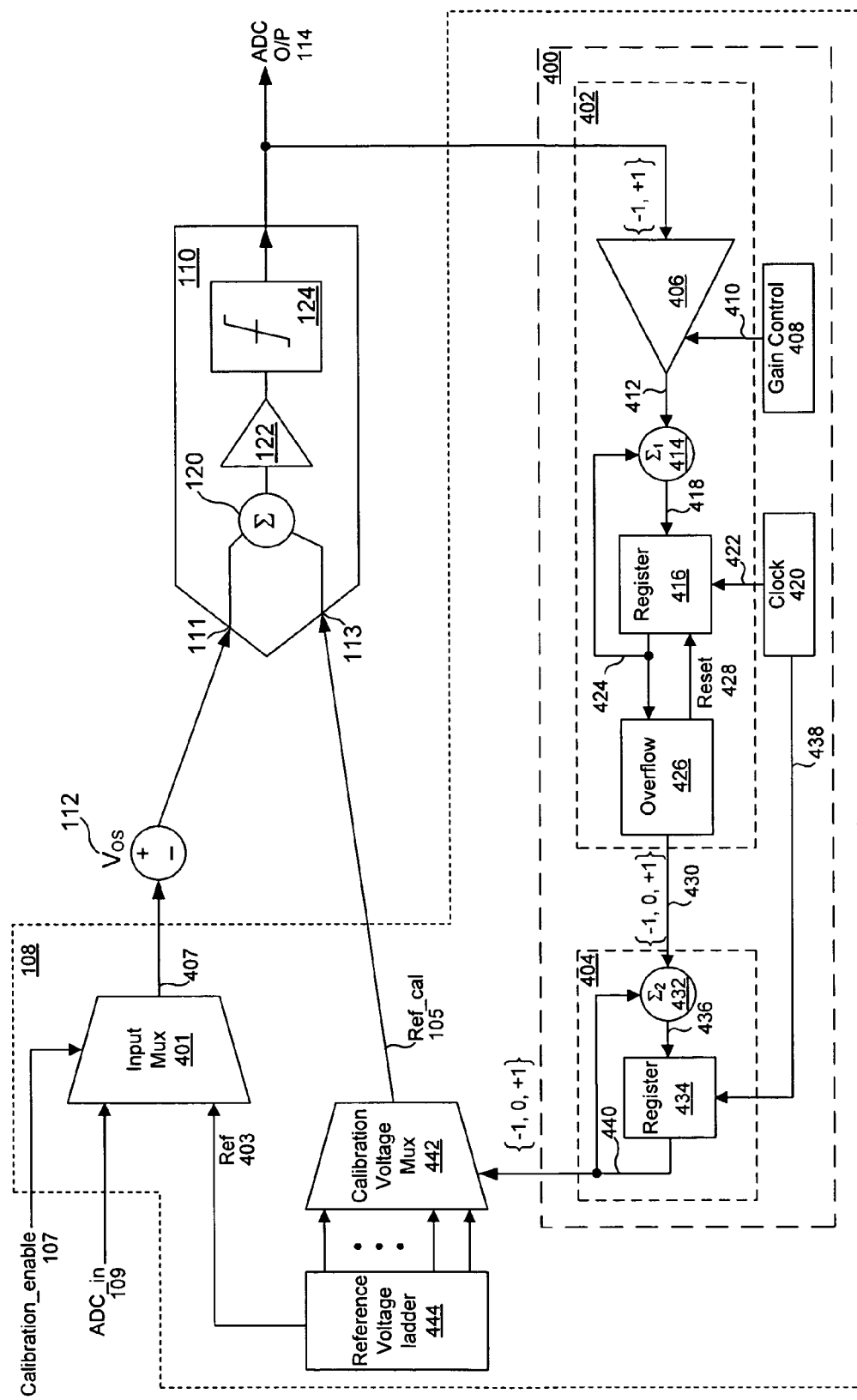
FIG. 4 illustrates an exemplary calibration circuit.

FIG. 4 illustrates an exemplary calibration circuit 108. In an example, the calibration circuit 108 illustrated in FIG. 4 functions as follows. The calibration voltage (Ref_cal) 105 is adjusted to compensate for the offset voltage (Vos) 112. During calibration, the reference voltage input 403 (Ref) is fed into the first input 111 of the ADC 110, then the calibration voltage (Ref_cal) 105 is adjusted to mitigate the effect of the offset voltage (Vos) 112. The calibration multiplexer 442 varies the calibration voltage (Ref_cal) 105 until the offset voltage 112 is calibrated out. Specifically, the feedback/integrator circuit 400 generates a control signal that varies the calibration voltage (Ref_cal) 105, until the ADC sees equal voltages at the ADC inputs 111 and 113. In one embodiment, only one of differential components of the calibration voltage (Ref_cal) 105 is varied at time. During normal operation, the input mux 401 switches the ADC_in signal 109 to the ADC input 111 for conversion, with the offset voltage 112 calibrated out. In an example, the feedback/integrator circuit 400 is a low pass filter.

The ADC input (ADC_in) 109 is coupled to an input multiplexer 401. Also coupled to the input multiplexer 401 is the calibration enable port 107 and a fixed voltage source, such as and not limited to, a reference voltage input 403 (Ref) that is generated from a reference ladder. The input multiplexer 401 has an output 407 coupled to the first input 111. Also coupled to the second input 113 is a variable voltage source, such as, and not limited to, a circuit having a reference voltage ladder 444 and a calibration voltage multiplexer 442 controlled by the calibration circuit 108. In an example, multiple input multiplexers 401 are combined to reduce the number of multiplexers and/or save space. In examples, the calibration voltage multiplexer 442 and the reference voltage ladder 444 are coupled to, but are not part of, the calibration circuit 108.

The ADC output 114 is coupled to an integrator circuit 400. The integrator circuit 400 has a first integrator 402 and a second integrator 404 coupled in series. The ADC output 114 is coupled to the input of an amplifier 406 in the first integrator 402. A gain control circuit 408 is also coupled to an input of the amplifier 406 via a gain control output 410. The amplifier 406 has an amplifier output 412 coupled to a first input of a first summation circuit 414. The first summation circuit 414 is coupled to a first register 416 via a first summation output 418. A clock circuit 420 is also coupled to the first register 416 via a first clock output 422. The first register 416 has a first register output 424. The first register output 424 is coupled to a second input of the first summation circuit 414 to provide a feedback path. The first register output 424 is coupled to an overflow circuit 426. The overflow circuit 426 has a reset output 428 coupled to the first register 416. The overflow circuit 426 has an overflow output 430 that is the output of the first integrator 402.

The overflow output 430 is coupled to a first input of a second summation circuit 432 in the second integrator 404. The second summation circuit 432 is coupled to a second register 434 via a second summation output 436. The clock circuit 420 is also coupled to the second register 434 via a second clock output 438. The first clock output 422 is identical to the second clock output 438. In examples, the first clock output 422 is different than the second clock output 438.

The second register 434 has a second register output that is the integrator circuit output 440. The integrator output 440 is a digital signal that has a least significant bit (LSB). In examples, the integrator output 440 is in a signed magnitude format. The output of the second flip flop 434 is coupled to a second input of the second summation circuit 432 to provide a feedback path. The output of the second flip flop 434 is also coupled to the calibration voltage multiplexer 442. The calibration voltage multiplexer 442 is coupled to the reference voltage ladder 444. An output of calibration voltage multiplexer 442 is coupled to a second input of the ADC 110 to provide the calibration voltage (Ref_cal) 105. In examples, the reference voltage ladder 444 provides a plurality of positive voltages, negative voltages, or a combination of positive and negative voltages.

The calibration circuit 108 illustrated in FIG. 4 functions as follows. The calibration voltage (Ref_cal) 105 is adjusted to compensate for the offset voltage (Vos) 112. In a calibrate mode, the reference voltage input 403 (Ref) is fed into the first input 111 of the ADC 110, then the calibration voltage (Ref_cal) 105 is adjusted to mitigate the effect of the offset voltage (Vos) 112.

The ADC input (ADC_in) 109 and the reference voltage input 403 (Ref) are input to the input multiplexer 401. The calibration enable port 107 controls which of the ADC input (ADC_in) 109 and the reference voltage input 403 (Ref) signals is coupled through the input multiplexer 401 to the input multiplexer output 407 and thus to the first input 111.

The ADC 110 functions as described above. The reference voltage input 403 (Ref) signal is a substantially fixed voltage signal. The ADC input (ADC_in) 109 is a variable voltage that is held constant when the track-and-hold circuit 104 is in the hold mode. The calibration voltage (Ref_cal) 105 is a variable voltage that is varied during calibration. The calibration voltage (Ref_cal) 105 is compared to either the reference voltage input 403 (Ref) or the ADC input (ADC_in) 109 by the ADC 110. As a result of the comparison, the ADC output 114 is either a logic "high" and/or a digital "1" or the ADC output signal is a logic "low" and/or a digital "−1". The ADC output 114 is input to the integrator circuit 400.

The integrator circuit 400 creates the integrator circuit output 440 to control the calibration voltage multiplexer 442. The integrator circuit output 440 is based on a ratio of high states to low states within the signal present at the ADC output 114 over a period of time determined by a clock signal provided by the clock 420. If the ratio is substantially equal to one, the integrator circuit output 440 holds the calibration voltage (Ref_cal) 105 at a substantially constant voltage. The integrator circuit output 440 is a logic "null" and/or a digital "0" to indicate that the calibration voltage (Ref_cal) 105 is to be held at a substantially constant voltage.

If the ratio is greater than one, the integrator circuit output 440 raises the calibration voltage (Ref_cal) 105. The integrator output sums its current digital value with either +1, 0, −1 from the previous stage. The larger the digital value, the larger the calibration voltage. The integrator circuit output 440 is raised to indicate that the calibration voltage (Ref_cal) 105 is to be raised. If the ratio is less than one, the integrator circuit output signal lowers the voltage of the calibration voltage (Ref_cal) 105. the integrator circuit output 440 is lowered to indicate that the calibration voltage (Ref_cal) 105 is to be lowered.

If the ratio is greater than one, the first integrator output 430 will eventually overflow and produce a +1 at its output which is then integrated (summed) by the second integrator 404. If the ratio is less than one, the first integrator output 430 will eventually underflow and produce a −1. The larger the ratio deviates from one, the first integrator 402 will produce a +1 or −1 more frequently and thus the second integrator output 440 changes more rapidly to cancel the offset voltage. When an overflow or underflow is reached, the first integrator 402 is reset to zero. Once steady state is reached, the first integrator output 430 will produce an average output of zero and the second integrator output 440 doesn't change.

An averaging operation is performed by the first integrator 402. This averaging helps filter out noise in the comparator decisions. The second integrator 404 accumulates the output of the first integrator. In examples, the ADC output 114 is integrated to create the integrator circuit output 440. In examples, other signal processing techniques are implemented to adjust a voltage input to the ADC 110 based on the ADC output 114.

The first integrator 402 determines a presence of the ADC offset voltage 112 by measuring the ratio of high states to low states within the signal present at the ADC output 114 over a period of time determined by a clock signal provided by the clock 420. The first integrator 402 provides a tri-state output at the overflow output 430 that indicates the ratio is greater than one, the ratio is substantially equal to one, or the ratio is less than one. A first state that indicates the ratio greater than one is the logic "high" and/or the digital "1". A second state that indicates the ratio less than one is the logic "low" and/or the digital "−1". A third state that indicates the ratio substantially equal to one is a "null" and/or a digital "0" state.

The first integrator 402 functions as follows. First the amplifier 406 adjusts a gain of the ADC output 114. The gain control 408 varies signal gain provided by the amplifier 406. The first summation circuit 414 processes first register output 424 and the amplifier output 412 to create the first summation output 418. As a result of the feedback provided by the first register output 424, the first summation output 418 is an integral of the amplifier output 412. The first register 416 samples the summation output 418 with sample timing determined by the first clock output 422. The clock circuit 420 produces the first clock output 422. The first register 416 provides the first register output 424. The overflow circuit 426 counts a number of logic states in the first register output 416. When the number of logic states in the first register output 424 reaches a predetermined number, the overflow circuit 426 issues a reset signal on the reset output 428 to reset the first register 416. The signal on the overflow output 430 is passed to the second integrator 404.

The second integrator 404 determines the integrator circuit output 440 by performing an integration on the overflow output 430 of the first integrator 402. The integrator circuit output 440 is a tri-state output as described above.

The second integrator 404 functions as follows. The second summation circuit 432 processes the second register output 440 and the overflow output 430 to create the second summation output 436. As a result of the feedback provided by the second register output 440, the second summation output 436 is an integral of the overflow output 430. The second summation output 436 is sampled by the second register 434 with sample timing determined by the second clock output 438. The second clock output 438 is produced by the clock circuit 420. The second register 434 provides the second register output which is also the output of the second integrator 404 and the integrator circuit output 440. The integrator circuit output 440 controls the calibration voltage multiplexer 442 to increase, hold substantially constant, or decrease the calibration voltage (Ref_cal) 105.

Reference Voltage Ladder and Multiplexer

Figure 5:
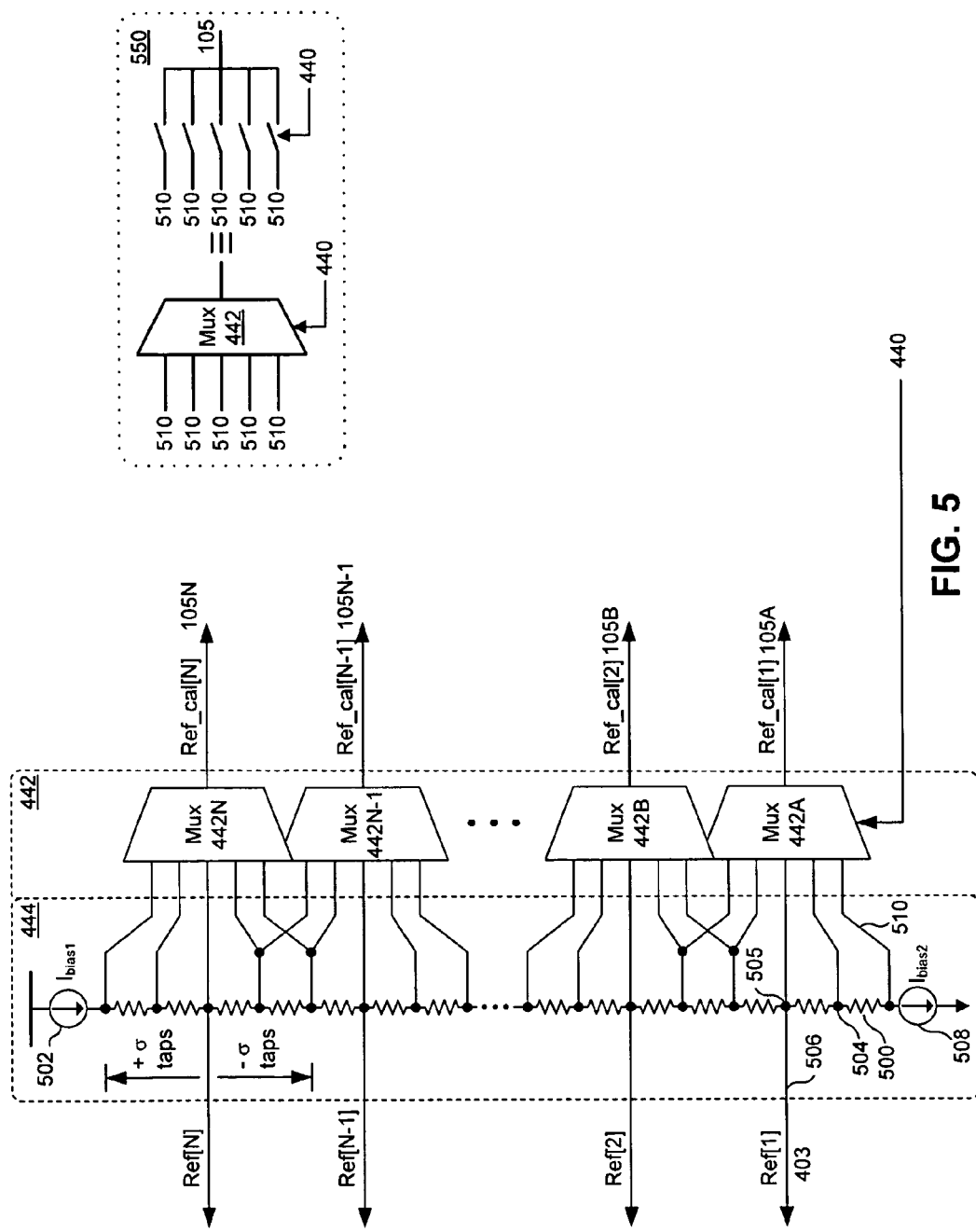
FIG. 5 illustrates an example of a reference voltage ladder and a multiplexer.

FIG. 5 illustrates the reference voltage ladder circuit 444 and the calibration voltage multiplexer 442. The reference voltage ladder circuit 444 provides a range of voltages and/or multiple voltages for use by at least one ADCs 110. In the example illustrated, each individual ADC 110 in an array of ADCs 110 has a respective calibration voltage multiplexer 442 that selects the calibration voltage (Ref_cal) 105. In examples, at least one calibration voltage multiplexer 442 selects the calibration voltage (Ref_cal) 105 for each ADC 110 in an array of ADCs 110.

The reference voltage ladder circuit 444 has more than one resistive element 500 coupled in series via nodes 504. The resistive elements 500 are coupled in series with a first current source 502 and a second current source 508. The resistive elements 500 are of equal or unequal resistance. A reference voltage tap 506 is coupled between a center node 505 and the input multiplexer 401. When coupled to an array of ADCs 110, a different reference voltage tap 506 is coupled between different center nodes 505 and each respective input multiplexer 401 to provide a different reference voltage (Ref(N)) to each respective input multiplexer 401. At least two calibration voltage taps 510 are also coupled between two different nodes 504 and the calibration voltage multiplexer 442. The number of calibration voltage taps 510 coupled to the calibration voltage multiplexer 442 determines a number of increments (2σ+1) in which a range of voltages is available and/or determines a range of the calibration voltages (Ref_cal) 105 available for selection by the calibration voltage multiplexer 442. The quantity of calibration voltage taps 510 coupled to the calibration voltage multiplexer 442 is determined by a statistical offset voltage of the comparator 124. The integrator circuit output 440 is also coupled to the calibration voltage multiplexer 442. The output of the calibration voltage multiplexer 442 (Ref_cal(N)) is coupled to the second input 113 to provide the calibration voltage (Ref_cal) 105.

The reference voltage ladder circuit 444 provides a variety of reference voltages and a range of calibration voltages that are centered around each reference voltage. The first current source 502 and second current source 508 provide current flow through the resistive elements 500. Current flow through the resistive elements 500 produces a voltage across each resistive element 500. Thus, different voltages are tapped by the reference voltage taps 506 and calibration voltage taps 510. The voltage drop across each individual resistive element 500 is substantially identical. In other examples, the voltage drops across each individual resistive element 500 are dissimilar. The reference voltage (Ref(N)) tapped by the reference voltage tap 506 is a fixed voltage relative to the calibration voltage (Ref_cal) 105 because the calibration voltage (Ref_cal) 105 is variable in increments dependent upon selective coupling performed by the calibration voltage multiplexer 442. In examples, the first current source 502 and the second current source 508 provide current flow in a direction opposite that shown in FIG. 5.

The calibration voltage multiplexer 442 selectively couples at least one calibration voltage tap 510 to the output of the calibration voltage multiplexer 442 and thus, the second input 113 to provide the calibration voltage (Ref_cal) 105. The integrator circuit output 440 determines which calibration voltage tap 510 and/or combinations of calibration voltage taps 510 are coupled by the calibration voltage multiplexer 442 to raise, hold substantially constant, or lower the calibration voltage (Ref_cal) 105 so as to eliminate the effect of the offset voltage 112. In other words, each multiplexer 442 iteratively selects the voltage at the taps 510 until the selected voltage cancels the effect of the offset voltage 112 in the ADC 110, where the effect is cancelled when the comparator 124 outputs a null voltage.

An example of the selective coupling and/or switching function 550 performed by the calibration voltage multiplexer 442 is also shown in FIG. 5.

Regulated Reference Voltage Ladder

Figure 6:
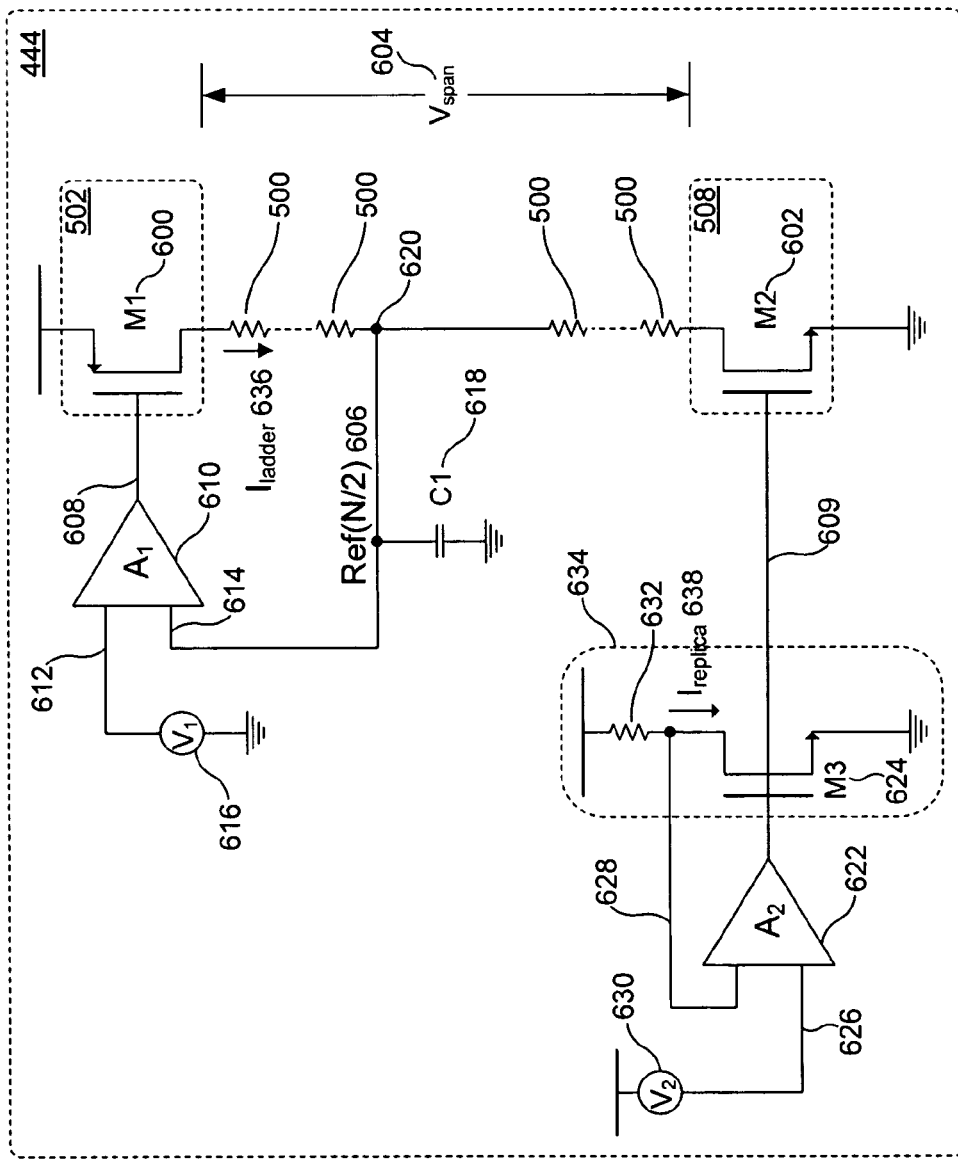
FIG. 6 illustrates an exemplary reference voltage ladder having a regulated output.

FIG. 6 illustrates an exemplary reference voltage ladder 444 having a regulated output. The reference voltage ladder 444 is regulated in two ways. First, a midpoint voltage of the ladder (ref(N/2)) 606, that is, the voltage present at a point equal to substantially one-half of the total resistance of the ladder, is regulated. Second, the voltage range (Vspan 604) across the entire collection of resistive elements 500 is regulated. The regulated reference voltage ladder 444 also has excellent supply noise rejection in a low-frequency band. In examples where the regulated reference voltage ladder 444 is used differentially, controlling the midpoint voltage of the ladder (ref(N/2)) also controls the common mode voltage of the reference voltage ladder 444. In examples, the regulated reference voltage ladder 444 is coupled to a circuit other than the calibration circuit 108, for example, the ADC 110.

The regulated reference voltage ladder 444 has a first transistor (M1) 600 as a first current source 502. A second transistor (M2) 602 is a second current source 508. The gate of the first transistor 600 is coupled to an output 608 of a first amplifier 610. The first amplifier 610 has a first input 612 and a second input 614. The first input 612 is coupled to a first voltage source 616. The second input 614 is coupled to a midpoint of the reference ladder 620, that is, a point equal to substantially one-half of the total resistance of the ladder. In examples, the second input 614 is coupled to the reference ladder at a point other than the ladder midpoint 620. A capacitor (C1) 618 is coupled between the second input 614 and ground. In examples, the capacitor 618 is omitted.

The gate of the second transistor 602 is coupled to an output 609 of a second amplifier 622 and the gate of a third transistor (M3) 624. The second amplifier 622 has a first input 626 and a second input 628. The first input 626 is coupled to a second voltage source 630. The second input 628 is coupled to a drain of the third transistor 624. The source of the third transistor 624 is coupled to ground. The drain of the third transistor 624 is coupled to a supply voltage via a resistor 632. The resistor 632 and the third transistor 624 are part of a replica circuit 634. In examples, N-channel devices replace P-channel devices, P-channel device replace N-channel devices, and the polarity of voltage sources is reversed. In examples, circuit elements described herein as being coupled to ground are instead coupled to another voltage source.

The reference voltage ladder 444 adjusts and regulates both the midpoint voltage of the ladder (ref(N/2)) 606 as well as the voltage range (Vspan) 604 across the entire collection of resistive elements 500. Adjusting the first voltage source 616 controls the midpoint voltage of the ladder (ref(N/2)) 606. Adjusting the second voltage source 630 controls the voltage range (Vspan) 604.

The first voltage source 616 provides a reference voltage to the first amplifier 610. The first amplifier second input 614 provides feedback to the first amplifier 610. The first amplifier 610 produces the first amplifier output 608 that is a function of the difference between the first amplifier's first input 612 and second input 614. The first amplifier output 608 varies the gate of the first transistor 600 to adjust a ladder current (Iladder) 636 supplied to the reference ladder by the first transistor 600. Varying the ladder current (Iladder) 636 alters the voltage drop across each resistive element 500 which in turn alters the midpoint voltage of the ladder (ref(N/2)) 606. The capacitor 618 decouples the reference ladder as well as compensates for the first amplifier 610. If the midpoint voltage of the ladder (ref(N/2)) 606 drifts, the change in voltage is fed back to the first amplifier 610 via the first amplifier's second input 614. The first amplifier 610 then adjusts the ladder current (Iladder) 636 to compensate for the voltage drift and regulate the midpoint voltage of the ladder (ref(N/2)) 606.

The second voltage source 630 provides a reference voltage to the second amplifier 622. The second amplifier's second input 628 provides feedback to the second amplifier 622 from the replica circuit 634. The feedback voltage is developed by a replica current (Ireplica) 638 flowing through the resistor 632. The replica circuit 634 is a replica of the reference ladder, thus the second transistor 602 mirrors the replica current (Ireplica) 638 through the third transistor 624. The second amplifier 622 produces a second amplifier output 609 that is a function of the difference between the second amplifier's first input 626 and second input 628. The second amplifier output 609 varies the gate of the second transistor 602 to adjust a current supplied to the reference ladder by the second transistor 602. Adjusting the current supplied to the reference ladder by the second transistor 602 controls the voltage range (Vspan) 604. If the voltage range (Vspan) 604 drifts, the change in voltage is fed back to the second amplifier 622 then via the second amplifier's second input 628. The second amplifier 622 adjusts the replica current (Ireplica) 638 to compensate for the voltage drift and regulate the voltage range (Vspan) 604.

Figure 7:
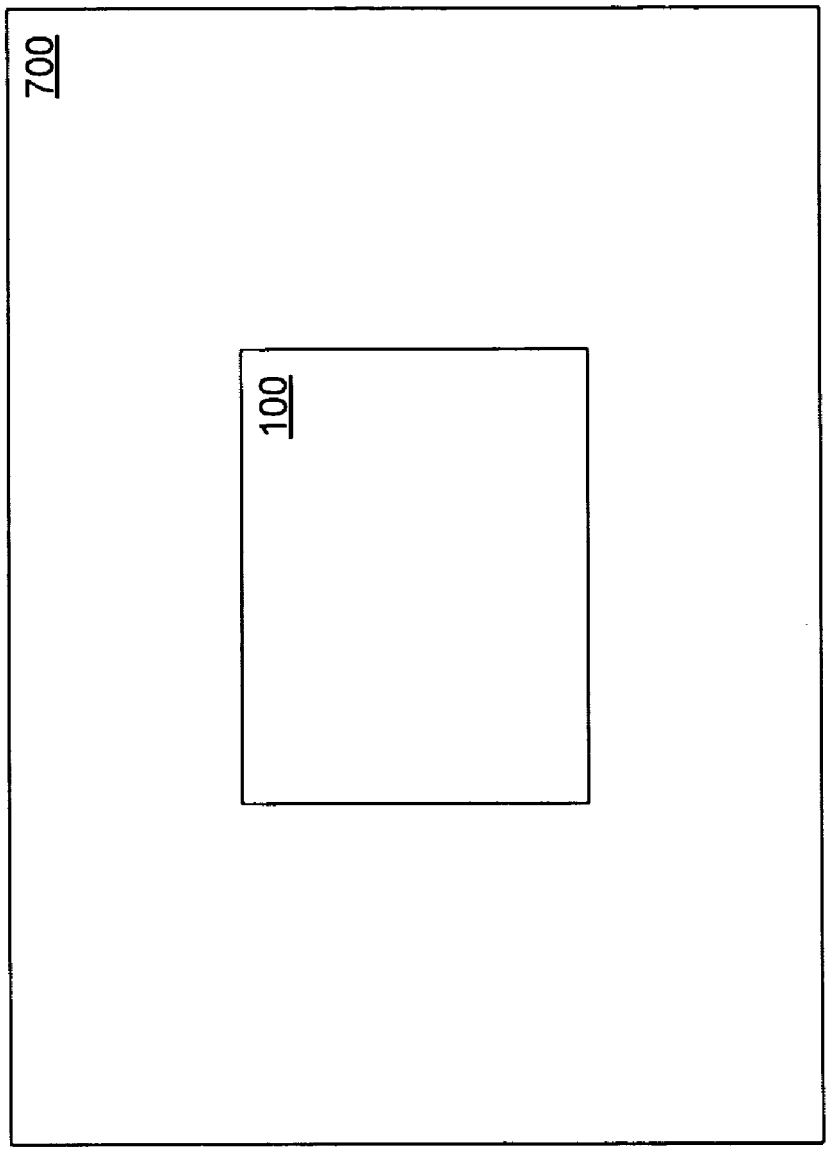
FIG. 7 illustrates an exemplary communication circuit.

FIG. 7 illustrates an exemplary communication circuit 700 that has the conversion circuit 100. In an example, the communication circuit 700 is an integrated circuit deposited on the substrate 102.

Conversion Circuit Operation

Figure 8:
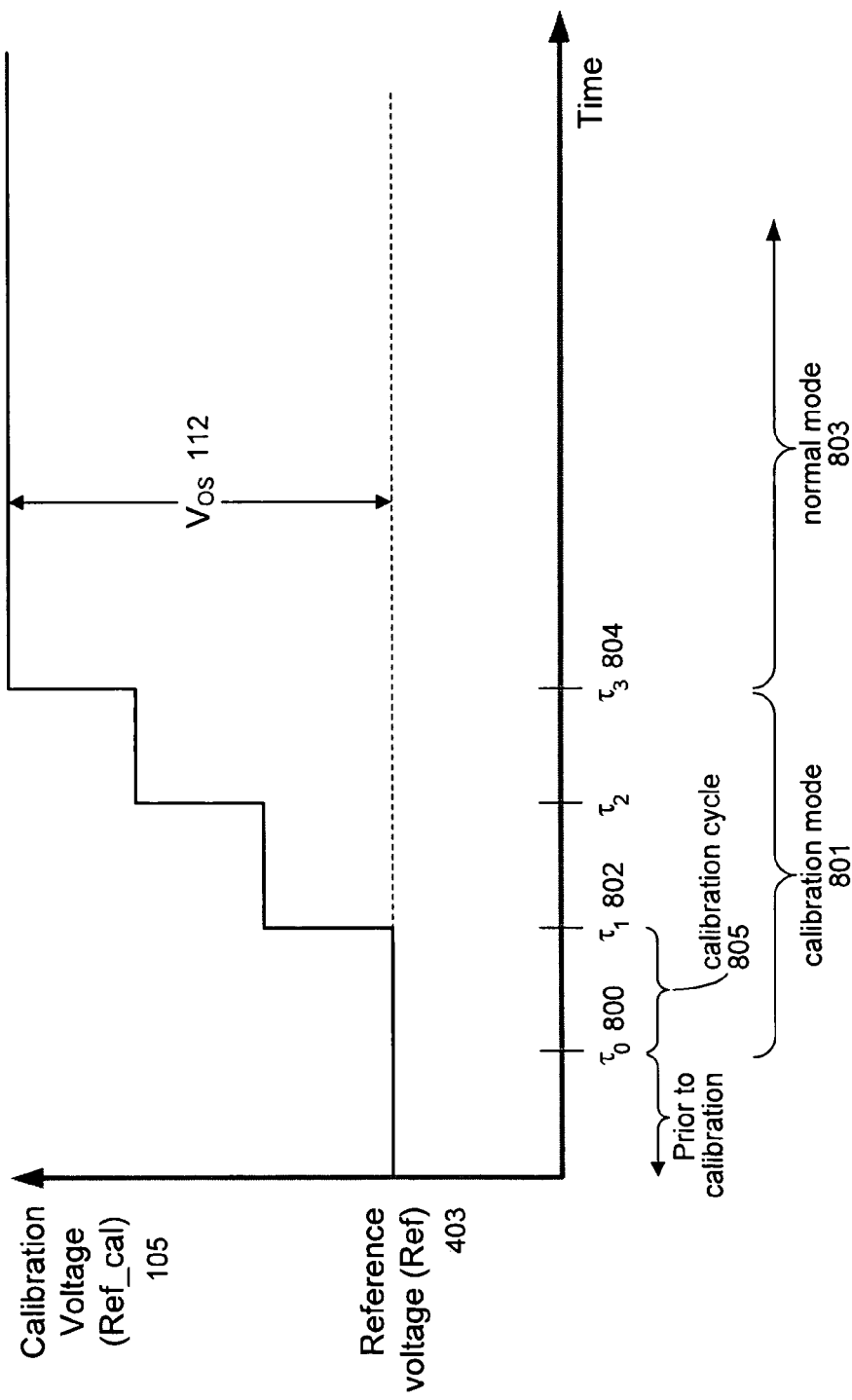
FIG. 8 illustrates exemplary changes in calibration voltage overtime.

FIG. 8 illustrates a exemplary changes in calibration voltage over time where the conversion circuit 100 functions in two modes, a calibration mode 801 and a normal mode 803. The calibration mode 801 executes prior to at least one execution of the normal mode 803.

During the calibration mode 801, effects of the offset voltage 112 are countered over at least one calibration cycle 805 by determining presence of the offset voltage 112 and varying the calibration voltage (Ref_cal) 105. The calibration_enable 107 directs the input multiplexer 401 to enter the calibration mode 801 by coupling the reference voltage input (Ref) 403 to the first input 111. The reference voltage input (Ref) 403 is a fixed voltage and initially substantially equals the variable calibration voltage (Ref_cal) 105. Thus, the ADC 110 compares the reference voltage input (Ref) 403 to the calibration voltage (Ref_cal) 105 to determine the ADC output 114. If the reference voltage input (Ref) 403 plus the offset voltage 112 is higher than the calibration voltage (Ref_cal) 105, the ADC output 114 is the logic "high" and/or the digital "1". If the reference voltage input (Ref) 403 plus the offset voltage 112 is lower than the calibration voltage (Ref_cal) 105, the ADC output 114 is the logic "low" and/or the digital "−1". If the offset voltage 112 does not affect the ADC output 114, then the ratio of the logic "high" signals to the logic "low" signals at the ADC output 114 substantially equals one over a period of time. The offset voltage 112 does not affect the ADC output 114 when the offset voltage 112 substantially equals zero volts and/or the calibration voltage (Ref_cal) 105 has been adjusted to counter effects of the offset voltage 112.

The integrator circuit 400 integrates the ADC output 114 over a period of time determined by a clock signal provided by the clock 420 to produce the integrator circuit output 440. If the ratio of the logic "1" and "0" at the ADC output 114 is substantially equal to one, the integrator circuit output 440 holds the calibration voltage (Ref_cal) 105 at a substantially constant voltage. If the ratio at the ADC output 114 is greater than one, the integrator circuit output 440 signals the calibration voltage multiplexer 442 that the calibration voltage (Ref_cal) 105 is to be raised. If the ratio at the ADC output 114 is less than one, the integrator circuit output 440 signals the calibration voltage multiplexer 442 that the calibration voltage (Ref_cal) 105 is to be lowered. The reference voltage ladder 444 supplies multiple voltages to the calibration voltage multiplexer 442 for possible selection as the calibration voltage (Ref_cal) 105. The calibration mode 801 continues with additional calibration cycles 805 until the calibration voltage (Ref_cal) 105 has been varied to a point where the ratio of the logic "high" signals to the logic "low" signals at the ADC output 114 is substantially equal to one. When calibration is complete, the calibration_enable 107 directs the input multiplexer 401 to enter the normal mode 803.

FIG. 8 illustrates exemplary changes in the calibration voltage (Ref_cal) 105 over time where the offset voltage 112 is positive. The calibration mode 801 starts at a time $T_0$ 800 with the calibration voltage (Ref_cal) substantially equal to the reference voltage input (Ref) 403. A first calibration cycle ends at time $T_1$ 801 with a step change in the calibration voltage (Ref_cal) 105 that counters at least part of the effects of the offset vltage 112. After three calibration cycles, at a time $T_3$ 804, the calibration voltage (Ref_cal) 105 has been varied such that the calibration voltage (Ref_cal) 105 substantially equals the reference voltage input (Ref) 403 plus the offset voltage 112. In other words, in this example, at the time $T_3$ 804, the calibration voltage (Ref_cal) 105 counters effects of the offset voltage 112. At time T3 804, the conversion circuit changes to the normal mode 803.

During the normal mode 803, the analog signal at the analog input port 106 is converted to the binary-coded output signal. The analog input signal is input to the track-and-hold circuit 104. During the track mode, the track-and-hold circuit 104 tracks the signal at the analog input port 106 to produce the ADC input (ADC_in) 109. During the hold mode, the track-and-hold circuit 104 holds the ADC input (ADC_in) 109 at a constant voltage equal to that of the analog signal present at the analog input port 106 at the moment the hold mode started.

The calibration_enable 107 directs the input multiplexer 401 to enter the normal mode 803 by coupling the ADC input (ADC_in) 109 to the first input 111. Thus, the ADC input (ADC_in) 109 is compared by the ADC 110 to the previously-calibrated calibration voltage (Ref_cal) 105 to determine the ADC output 114. If the ADC input (ADC_in) 109 is higher than the calibration voltage (Ref_cal) 105, the ADC output 114 is the logic "high" and/or the digital "1". If the ADC input (ADC_in) 109 is lower than the calibration voltage (Ref_cal) 105, the ADC output 114 is the logic "low" and/or the digital "0". The ADC output 114 is input to the encoder 116 along with other ADC outputs from the array of ADCs 110. The array of ADCs 110 as shown in FIG. 1 produces the thermometer code signal as the input to the encoder 116. The encoder 116 converts the thermometer code to the binary code. The binary-coded encoder output 118 is the output of the conversion circuit 100.

In examples, the conversion circuit 100 reenters the calibration mode 801 from the normal mode 803 to adjust for changes in offset voltage 112. Reentry into calibration mode is periodic. In examples, reentry into the calibration mode 801 from the normal mode 803 occurs on an as-needed and/or random basis.

Figure 9:
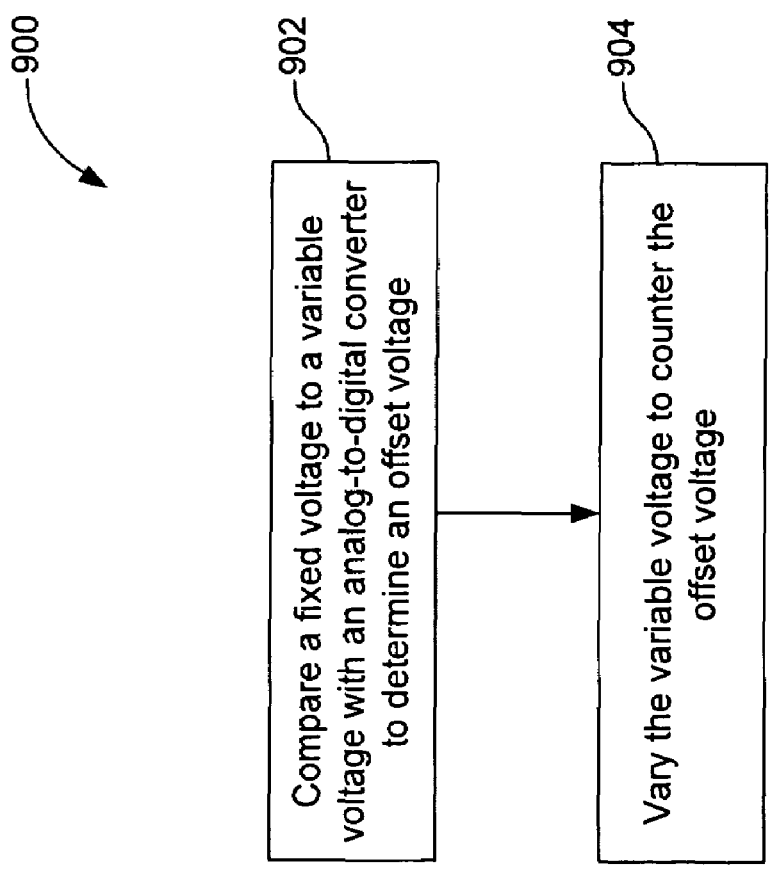
FIG. 9 illustrates an exemplary method for performing ADC calibration.

FIG. 9 shows an exemplary method 900 for countering an ADC offset voltage to calibrate an ADC. In step 902, a fixed voltage is compared to a variable voltage with an analog-to-digital converter to determine an offset voltage. In examples, the fixed voltage and the variable voltage are substantially equal. In further examples, comparing the variable voltage to an analog signal determines an ADC output signal. In examples, the ADC output signal is integrated at least once to provide a control signal that varies the variable voltage.

In step 904, the variable voltage is varied to counter the offset voltage which calibrates the ADC. In examples, the ADC output has at least one of a logic high and a logic low signal and varying the variable voltage causes a ratio of the logic high signals to the logic low signals to substantially equal one. In examples, the fixed voltage or an analog signal are selectively coupled to an ADC input. In examples, at least one of the fixed voltage and the variable voltage are regulated. In examples, at least one of the fixed voltage and a range of the variable voltage are adjusted and/or regulated.

Figure 10:
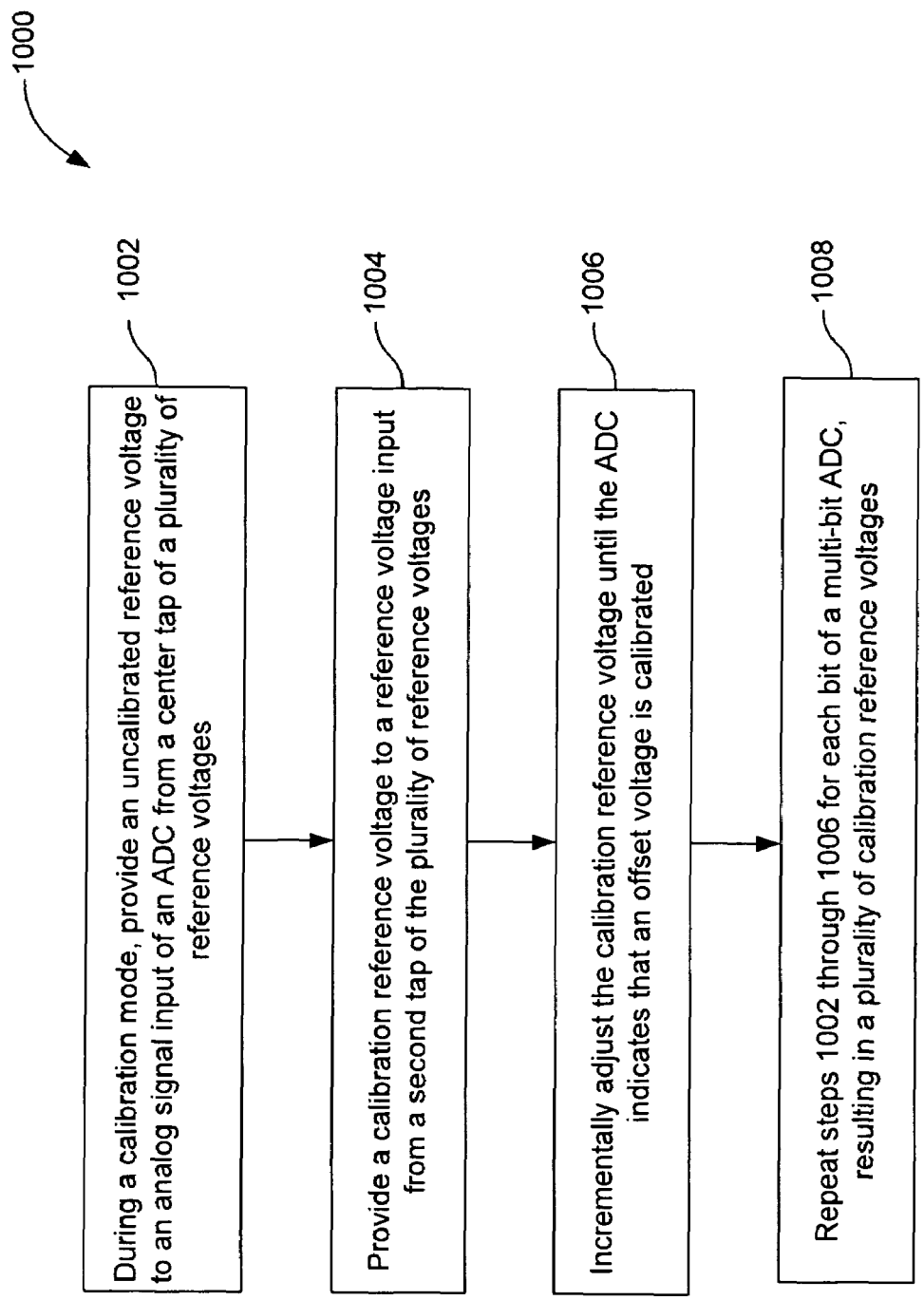
FIG. 10 illustrates an exemplary method for mitigating a DC offset in a multi-bit ADC.

FIG. 10 illustrates an exemplary method 1000 for mitigating a DC offset in a multi-bit ADC. Each bit of the multi-bit ADC has an analog signal input and a reference voltage input. The reference voltage input is selectively coupled to a plurality of reference voltages selectable from a plurality of taps. A calibration mode has steps 1002 through 1008. In step 1002, an uncalibrated reference voltage is provided to the analog signal input of the ADC from a center tap of the plurality of reference voltages. In step 1004, a calibration reference voltage is provided to the reference voltage input from a second tap of the plurality of reference voltages. In step 1006, the calibration reference voltage is incrementally adjusted until the ADC indicates the offset voltage is calibrated. In step 1008, steps 1002 through 1006 are repeated for each bit of the multi-bit ADC. This results in a plurality of calibration reference voltages. In an example, step 1006 has incremental selection of the calibration reference voltage from the plurality of reference voltages until an ADC output indicates the reference voltage input is substantially equal to the analog signal input.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. An analog-to-digital conversion circuit, comprising:
an analog-to-digital converter (ADC) having a first input, a second input, and an output;
a multiplexer coupled to said first ADC input;
a variable voltage source coupled to said second ADC input; and
a calibration circuit to control said variable voltage source, and coupled between said variable voltage source and said ADC output,
wherein the ADC is configured to compare a fixed voltage supplied via said multiplexer with a variable voltage supplied by said variable voltage source.

2. The analog-to-digital conversion circuit of claim 1, further comprising said multiplexer coupled to a fixed voltage source, an analog input port, and an enable port.

3. The analog-to-digital conversion circuit of claim 1, wherein said calibration circuit includes:
  a first integrator having an input and an output, wherein said first integrator input is coupled to said ADC output; and
  a second integrator coupled between said first integrator output and said variable voltage source.

4. The analog-to-digital conversion circuit of claim 3, wherein said first integrator further includes:
  an amplifier having an input and an output, wherein said amplifier input is coupled to said ADC output;
  a summation circuit having a first input coupled to said amplifier output, a second input, and an output;
  a register having an input coupled to said summation circuit output, an output coupled to said second input, and a reset input; and
  an overflow circuit having an input coupled to said register output, an overflow output coupled to the second integrator, and a reset output coupled to said register reset input.

5. The analog-to-digital conversion circuit of claim 4, wherein said first integrator further includes a gain control circuit coupled to said amplifier.

6. The analog-to-digital conversion circuit of claim 3, wherein said second integrator includes:
  a summation circuit having a first input coupled to said first integrator, a second input, and an output; and
  a register having:
    an input coupled to said summation circuit output and
    an output coupled to said summation circuit second input and said variable voltage source.

7. The analog-to-digital conversion circuit of claim 1, wherein said variable voltage source includes:
  means for providing multiple voltages and
  means for multiplexing voltages coupled to said means for providing multiple voltages, said calibration circuit, and said second ADC input.

8. The analog-to-digital conversion circuit of claim 7, wherein said means for providing multiple voltages includes a reference voltage ladder comprising:
  a first current source;
  a second current source;
  a plurality of resistors coupled in series with said first current source and said second current source; and
  a tap coupled between two resistors in said plurality of resistors, wherein said tap is coupled to said means for multiplexing voltages.

9. The analog-to-digital conversion circuit of claim 8, wherein a quantity of said taps is based on a statistical offset voltage of an ADC comparator.

10. The analog-to-digital conversion circuit of claim 8, wherein said tap is coupled to said means for multiplexing voltages.

11. The analog-to-digital conversion circuit of claim 8, wherein said reference voltage ladder further comprises:
  wherein said first current source is a first transistor having a gate;
  wherein said second current source is a second transistor having a gate;
  a first amplifier having a first and second input and an output;
  wherein said first amplifier output is coupled to said first transistor gate;
  wherein said plurality of resistors includes a first resistor coupled to a node and a second resistor coupled to said node;
  wherein said first amplifier second input is coupled to said node;
  a first voltage source coupled to said first amplifier first input;
  a second amplifier having a first and second input and an output;
  wherein said second amplifier output is coupled to said second transistor gate;
  a second voltage source coupled to said second amplifier first input; and
  a replica circuit including:
    a third transistor having:
      a drain coupled to said second amplifier second input;
      a gate coupled to said second amplifier output; and
      a source coupled to ground, and
    a resistor coupled between a supply voltage and said third transistor drain.

12. The analog-to-digital conversion circuit of claim 11, wherein said reference voltage ladder further comprises a capacitor coupled between said first amplifier second input and ground.

13. The analog-to-digital conversion circuit of claim 11, wherein substantially one-half of a total resistance of said plurality of resistors is coupled between said node and said first current source.

14. The analog-to-digital conversion circuit of claim 1, further comprising a track-and-hold circuit coupled to said multiplexer.

15. The analog-to-digital conversion circuit of claim 1, further comprising an encoder coupled to said ADC output.

16. The analog-to-digital conversion circuit of claim 15, wherein said encoder converts from a thermometer code to a binary code.

17. The analog-to-digital conversion circuit of claim 1, wherein at least a part of said conversion circuit is deposited on a substrate.

18. A method for countering an analog-to-digital converter (ADC) offset voltage to calibrate an analog-to-digital converter, comprising:
  comparing a fixed voltage to a variable voltage with the ADC to determine an ADC offset voltage and produce an ADC output;
  integrating said ADC output at least once to provide a control signal; and
  varying said variable voltage with said control signal to counter the ADC offset voltage,
  wherein said ADC output includes at least one of a logic high and a logic low signal and wherein said varying causes a ratio of said logic high signal to said logic low signal to substantially equal one.

19. The method of claim 18, wherein said fixed voltage and said variable voltage are substantially equal.

20. The method of claim 18, further comprising selectively coupling said fixed voltage or an analog signal to an ADC input.

21. The method of claim 18, further comprising comparing said variable voltage to an analog signal to determine an ADC output signal.

22. The method of claim 18, further comprising regulating at least one of said fixed voltage and said variable voltage.

23. The method of claim 18, further comprising adjusting at least one of said fixed voltage and a range of said variable voltage.

24. An analog-to-digital conversion circuit, comprising:
means for comparing a fixed voltage to a variable voltage with an analog-to-digital converter (ADC) to determine an offset voltage; said means including:
a reference ladder having a plurality of taps that generate a plurality of reference voltages, including a fixed center tap reference voltage;
a first multiplexer having a first input configured to receive an analog signal and a second input coupled to said fixed center tap reference voltage;
a second multiplexer coupled to an output of said reference ladder for selecting one of said plurality of reference voltages as a variable calibration reference voltage; and
an analog-to-digital converter (ADC) having an analog signal input coupled to an output of said first multiplexer, and a reference signal input coupled to an output of said second multiplexer,
wherein during calibration, said first multiplexer is configured to couple said fixed center tap reference voltage to said analog signal input of said ADC; and
means for varying said variable voltage to counter said offset voltage.

25. A method of mitigating a DC offset in a multi-bit analog to digital converter (ADC), each bit of said multi-bit ADC having an analog signal input and a reference voltage input, said reference voltage input selectively coupled to a plurality of reference voltages selectable from a plurality of taps, comprising the steps of:
during a calibration mode,
(1) providing an uncalibrated reference voltage to said analog signal input of said ADC from a center tap of said plurality of reference voltages;
(2) providing a calibration reference voltage to said reference voltage input from a second tap of said plurality of reference voltages;
(3) incrementally adjusting said calibration reference voltage until said ADC indicates that said offset voltage is calibrated; and
(4) repeating steps (1)-(3) for each bit of said multi-bit ADC, resulting in a plurality of calibration reference voltages.

26. The method of claim 25, wherein step (3) includes the step of incrementally selecting said calibration reference voltage from said plurality of reference voltages until an ADC output indicates that said reference voltage input is substantially equal to said analog signal input.

27. The method of claim 25, further comprising the steps of:
during a normal operation mode,
(5) disconnecting said uncalibrated reference voltage from said analog signal input, and connecting an analog signal to said analog signal input; and
(6) converting said analog signal to digital using said plurality of calibration voltages, including the step of comparing said analog signal to said plurality of calibration reference voltages to generate a binary code that represents said analog signal.

28. A multi-bit conversion circuit with DC offset calibration, each bit of said conversion circuit comprising:
a reference ladder having a plurality of taps that generate a plurality of reference voltages, including a center tap reference voltage;
a first multiplexer having a first input configured to receive an analog signal and a second input coupled to said center tap reference voltage;
a second multiplexer coupled to an output of said reference ladder for selecting one of said plurality of reference voltages as a calibration reference voltage; and
an analog-to-digital converter (ADC) having an analog signal input coupled to an output of said first multiplexer, and a reference signal input coupled to an output of said second multiplexer;
wherein during calibration, said first multiplexer is configured to couple said center tap reference voltage to said analog signal input of said ADC.

29. The multi-bit conversion circuit of claim 28, wherein during calibration, said calibration reference voltage is varied to compensate for a DC offset of said ADC.

30. The multi-bit conversion circuit of claim 29, wherein said second multiplexer incrementally selects one of said plurality of reference voltages as said calibration reference voltage, until said ADC indicates said analog signal input is substantially equal to said reference signal input.

31. The multi-bit conversion circuit of claim 30, further comprising a feedback control circuit that controls said incremental selection by said second multiplexer based on an output of said ADC.

32. The multi-bit conversion circuit of claim 28, wherein during normal operation, said first multiplexer is configured to couple said analog signal to said analog signal input of said ADC.

* * * * *